(12) United States Patent
Jiang et al.

(10) Patent No.: US 7,973,305 B2
(45) Date of Patent: Jul. 5, 2011

(54) THIN FILM TRANSISTOR

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (CN)

( * ) Notice: Subject to any disclaimer, the term of this patent is extended or adjusted under 35 U.S.C. 154(b) by 0 days.

(21) Appl. No.: 12/384,299

(22) Filed: Apr. 2, 2009

(65) Prior Publication Data

US 2009/0283771 A1 Nov. 19, 2009

(30) Foreign Application Priority Data

May 14, 2008 (CN) .......................... 2008 1 0067164

(51) Int. Cl.
*H01L 29/06* (2006.01)

(52) U.S. Cl. .................. 257/24; 257/9; 257/40; 257/57; 257/66

(58) Field of Classification Search .................. 257/24, 257/9, 40, 57, 66
See application file for complete search history.

(56) References Cited

U.S. PATENT DOCUMENTS

| | | | |
|---|---|---|---|
| 6,423,583 B1 | 7/2002 | Avouris et al. | |
| 6,814,832 B2 | 11/2004 | Utsunomiya | |
| 6,921,575 B2 | 7/2005 | Horiuchi et al. | |
| 7,141,816 B2 | 11/2006 | Noda | |
| 7,285,501 B2 | 10/2007 | Mardilovich et al. | |
| 7,399,400 B2 | 7/2008 | Soundarrajan et al. | |
| 7,537,975 B2 | 5/2009 | Moon et al. | |
| 2002/0163079 A1 | 11/2002 | Awano | |
| 2004/0251504 A1 | 12/2004 | Noda | |
| 2005/0061496 A1 | 3/2005 | Matabayas, Jr. | |
| 2005/0079659 A1 | 4/2005 | Duan et al. | |
| 2005/0106846 A1 | 5/2005 | Dubin et al. | |
| 2005/0189535 A1 | 9/2005 | Hsueh et al. | |
| 2006/0249817 A1 | 11/2006 | Kawase et al. | |
| 2007/0004191 A1 | 1/2007 | Gu et al. | |
| 2007/0012922 A1 | 1/2007 | Harada et al. | |
| 2007/0029612 A1* | 2/2007 | Sandhu .......................... 257/347 |
| 2007/0069212 A1* | 3/2007 | Saitoh et al. ..................... 257/59 |

(Continued)

FOREIGN PATENT DOCUMENTS

CN 1484865 3/2004

(Continued)

OTHER PUBLICATIONS

R. E. I. Schropp, B. Stannowski, J. K. Rath, New challenges in thin film transistor research, Journal of Non-Crystalline Solids, 299-302, 2002, 1304-1310,2002.

(Continued)

*Primary Examiner* — Long Pham
(74) *Attorney, Agent, or Firm* — D. Austin Bonderer

(57) ABSTRACT

A thin film transistor includes a source electrode, a drain electrode, a semiconducting layer, and a gate electrode. The drain electrode is spaced from the source electrode. The semiconducting layer is connected to the source electrode and the drain electrode. The gate electrode is insulated from the source electrode, the drain electrode, and the semiconducting layer by an insulating layer. The semiconducting layer comprises at least two stacked carbon nanotube films, and each carbon nanotube film comprises a plurality of carbon nanotubes primarily oriented along a same direction, and the carbon nanotubes in at least two adjacent carbon nanotube films are aligned along different directions.

19 Claims, 5 Drawing Sheets

U.S. PATENT DOCUMENTS

| | | | |
|---|---|---|---|
| 2007/0085460 A1 | 4/2007 | Harutyunyan et al. | |
| 2007/0108480 A1 | 5/2007 | Nanai et al. | |
| 2007/0132953 A1 | 6/2007 | Silverstein | |
| 2007/0138010 A1* | 6/2007 | Ajayan | 204/400 |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2008/0042287 A1* | 2/2008 | Furukawa et al. | 257/758 |
| 2008/0134961 A1 | 6/2008 | Bao et al. | |
| 2008/0173864 A1 | 7/2008 | Fujita et al. | |
| 2008/0252202 A1 | 10/2008 | Li et al. | |
| 2008/0265293 A1 | 10/2008 | Lee et al. | |
| 2008/0277718 A1 | 11/2008 | Ionescu et al. | |
| 2009/0098453 A1 | 4/2009 | Liu et al. | |
| 2009/0159891 A1 | 6/2009 | Daniel et al. | |
| 2009/0224292 A1 | 9/2009 | Asano et al. | |
| 2009/0272967 A1* | 11/2009 | Afzali-Ardakani et al. | 257/40 |
| 2009/0282802 A1 | 11/2009 | Cooper et al. | |
| 2010/0028613 A1 | 2/2010 | Schmidt et al. | |

FOREIGN PATENT DOCUMENTS

| | | |
|---|---|---|
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | WO2007089322 | 8/2007 |
| WO | WO2007126412 | 11/2007 |
| WO | WO2008075642 | 6/2008 |

OTHER PUBLICATIONS

Li "Removal of shells of multi-wall carbon nanotubes by repeatedly scanning bias voltage" Science in China Ser. E, Technological Sciences, vol. 47 No. 1 pp. 1-5 (2004).

Hines "Nanotransfer printing of organic and carbon nanotube thin-film transistors on plastic substrates", Applied Physics Letters,86,163101 (2005).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Hines "Nanotransfer printing of organic and carbon nanotube thin-film transisitors on plastic substrates", Applied Physics Letters 86, 163101(2005).

"Building Carbon Nanotube Transistors " IBM research article on IBM research site Aug. 14, 2004 http://www.research.ibm.com/resources/press/Transistors/.

Minko et al. "Two-level structured self-adaptive surfaces with reversibly tunable properties", Journal of American Chemical Society, 125, pp. 3896-3900, 2003.

Meitl et al., Solution Casting and Transfer Printing Single-Walled Carbon Nanotube Films, Nano Letters, 2004, vol. 4, No. 9.

* cited by examiner

THIN FILM TRANSISTOR

RELATED APPLICATIONS

This application is related to commonly-assigned applications entitled, "METHOD FOR MAKING THIN FILM TRANSISTOR", U.S. patent application Ser. No. 12/384,245, filed Apr. 02, 2009); "METHOD FOR MAKING THIN FILM TRANSISTOR", U.S. patent application Ser. No. 12/384,331, filed Apr. 02, 2009; "THIN FILM TRANSISTOR"U.S. patent application Ser. No. 12/384,329, filed Apr. 02, 2009; "THIN FILM TRANSISTOR PANEL", U.S. patent application Ser. No. 12/384,309, filed Apr. 02, 2009; "THIN FILM TRANSISTOR PANEL", U.S. patent application Ser. No. 12/384,244, filed Apr. 02, 2009; "THIN FILM TRANSISTOR", U.S. patent application Ser. No. 12/384,281, filed Apr. 02, 2009; "THIN FILM TRANSISTOR", U.S. patent application Ser. No. 12/384,330, filed Apr. 02, 2009; "THIN FILM TRANSISTOR", U.S. patent application Ser. No. 12/384,292, filed Apr. 02, 2009; "THIN FILM TRANSISTOR", U.S. patent application Ser. No. 12/384,293, filed Apr. 02, 2009; "THIN FILM TRANSISTOR", U.S. patent application Ser. No. 12/384,310, filed Apr. 02, 2009; "METHOD FOR MAKING THIN FILM TRANSISTOR", U.S. patent application Ser. No. 12/384,241, filed Apr. 02, 2009; and "THIN FILM TRANSISTOR", U.S. patent application Ser. No. 12/384,238, filed Apr. 02, 2009. The disclosures of the above-identified applications are incorporated herein by reference.

BACKGROUND

1. Technical Field

The present disclosure relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation. In use, the thin film transistor modulates carriers in an interface between the insulation layer and the semiconducting layer from an accumulation state to a depletion state, with voltage applied to the gate electrode. Thus, the thin film transistor can change the amount of the current passing between the drain electrode and the source electrode. In practical use, a high carrier mobility affect of the material of the semiconducting layer of the thin film transistor is desired.

Previously, the material of the semiconducting layer has been amorphous silicone (a-Si), poly-silicone (p-Si), or organic semiconducting material. The carrier mobility of an a-Si thin film transistor is lower than a p-Si thin film transistor. However, the method for making the p-Si thin film transistor is complicated and has a high cost. The organic thin film transistor is flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction thereof can reach about 1000 to 1500 $cm^2V^{-1}s^{-1}$. Thus, a thin film transistor adopting carbon nanotubes as a semiconducting layer has been produced.

A conventional carbon nanotube based thin film transistor is generally made by the method of printing the mixture of carbon nanotubes and a polymer on a substrate to form a semiconducting layer. There are some problems in the thin film transistor adopting carbon nanotubes as a semiconducting layer. Firstly, the carbon nanotubes are prone to aggregate in the mixture. Thus, the carbon nanotubes cannot be uniformly dispersed in the carbon nanotube layer. Secondly, the organic solvent is hard to eliminate from the carbon nanotube layer. Thus, impurities exist in the carbon nanotube layer. Thirdly, the carbon nanotubes in the carbon nanotube layer lack high carrier mobility and cannot be well used in the thin film transistor. Additionally, the carbon nanotube layer formed by the printing method is inflexible. Accordingly, the thin film transistor is inflexible.

What is needed, therefore, is providing a thin film transistor that has high carrier mobility and is flexible.

BRIEF DESCRIPTION OF THE DRAWINGS

Many aspects of the present thin film transistor can be better understood with references to the following drawings. The components in the drawings are not necessarily drawn to scale, the emphasis instead being placed upon clearly illustrating the principles of the present thin film transistor.

Figure 1:
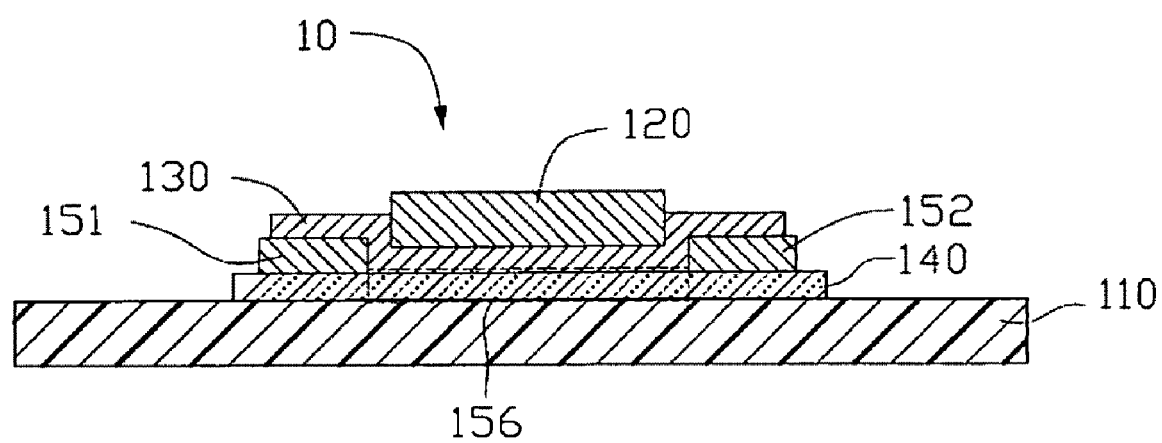
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the disclosure in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconducting layer 140, a source electrode 151, a drain electrode 152, an insulating layer 130, and a gate electrode 120. The thin film transistor 10 is located on an insulating substrate 110.

The semiconducting layer 140 is located on the insulating substrate 110. The source electrode 151 and the drain electrode 152 are connected to the semiconducting layer 140 and spaced from each other a certain distance. The insulating layer 130 is located between the semiconducting layer 140 and the gate electrode 120. The insulating layer 130 is located at least on the semiconducting layer 140, or covers at least part of the semiconducting layer 140, the source electrode 151, and the drain electrode 152. The gate electrode 120 is located on the insulating layer 130. The gate electrode 120 is located on the semiconducting layer 140 and insulated from the semiconducting layer 140, the source electrode 151, and the drain electrode 152 by the insulating layer 130. A channel 156 is formed in the semiconducting layer 140 at a region between the source electrode 151 and the drain electrode 152.

The source electrode 151 and the drain electrode 152 can be located on the semiconducting layer 140 or on the insulating substrate 110. More specifically, the source electrode 151 and the drain electrode 152 can be located on a top surface of the semiconducting layer 140, and on a same side of the semiconducting layer 140 as the gate electrode 120. In other embodiments, the source electrode 151 and the drain electrode 152 can be located on the insulating substrate 110 and covered by the semiconducting layer 140. The source electrode 151 and the drain electrode 152 are located on different sides of the semiconducting layer 140. In other embodiments, the source electrode 151 and the drain electrode 152 can be formed on the insulating substrate 110, and coplanar with the semiconducting layer 140.

The insulating substrate 110 is provided for supporting the thin film transistor 10. The material of the insulating substrate 110 can be the same as a substrate of a printed circuit board (PCB), and can be selected from rigid materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 is arbitrary. A plurality of thin film transistors 10 can be located on an insulating substrate 110 to form a thin film transistor panel.

The material of the semiconducting layer 140 can be selected from a group consisting of amorphous silicone (a-Si), poly-silicone (p-Si), organic semiconducting material, and semiconducting carbon nanotubes. In the present embodiment, the semiconducting layer 140 is a semiconducting carbon nanotube layer. The semiconducting carbon nanotube layer includes a plurality of single-walled carbon nanotubes, double-walled carbon nanotubes, or combination thereof. A diameter of the single-walled carbon nanotubes is in the range from about 0.5 nanometers to about 50 nanometers. A diameter of the double-walled carbon nanotubes is in the range from about 1.0 nanometer to about 50 nanometers. In the present embodiment, the diameter of the semiconducting carbon nanotubes is less than 10 nanometers.

The semiconducting carbon nanotube layer includes at least two stacked carbon nanotube films. Each carbon nanotube film of the semiconducting carbon nanotube layer is formed by a plurality of carbon nanotubes primarily oriented along a same direction in each film. The carbon nanotubes in at least two stacked carbon nanotube films can be aligned along different directions. The carbon nanotube film includes a plurality of successive and oriented carbon nanotubes joined end to end by van der Waals attractive force. The adjacent carbon nanotube films are combined by van der Waals attractive force therebetween. An angle α exist between the aligned directions of the carbon nanotubes in two adjacent carbon nanotube films. The angle α ranges from about 0 degree to about 90 degrees. The carbon nanotubes in at least one carbon nanotube films of the semiconducting layer 140 are oriented along a direction from the source electrode 151 to the drain electrode 152.

Figure 2:
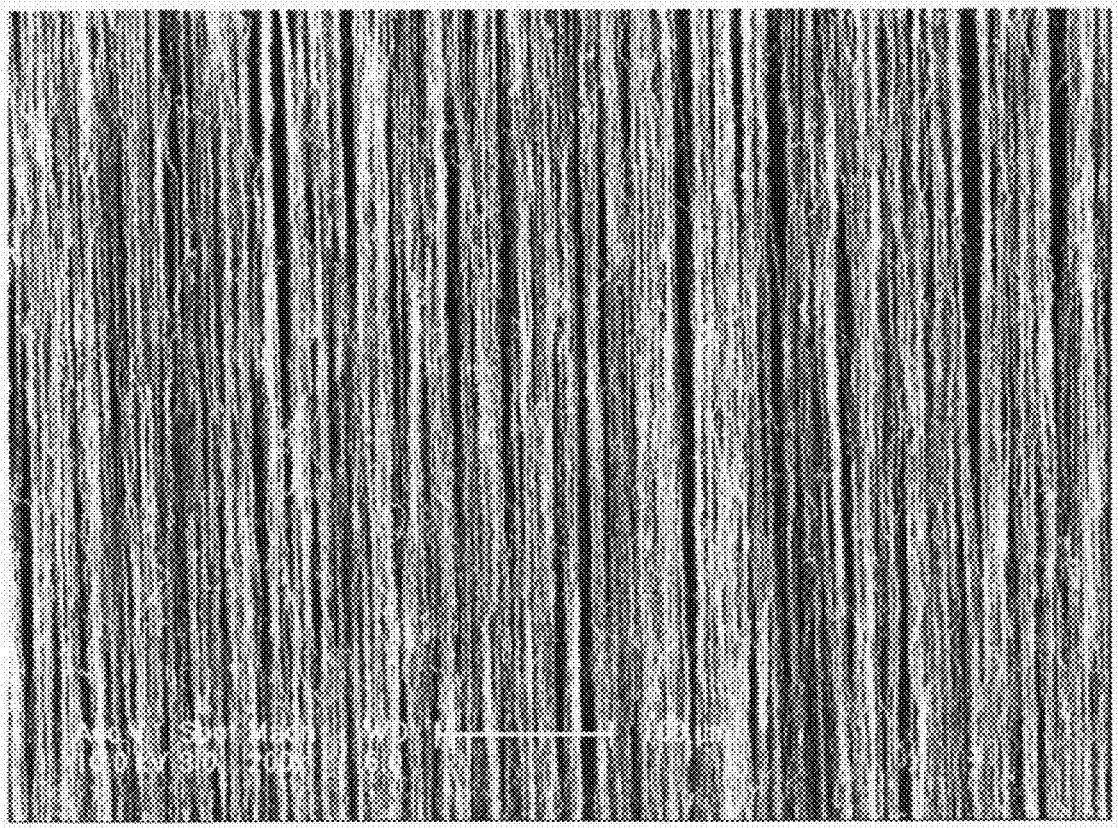
FIG. 2 shows a Scanning Electron Microscope (SEM) image of a carbon nanotube film containing semiconducting carbon nanotubes used in the thin film transistor of FIG. 1.

Referring to FIG. 2, the carbon nanotube film can be pulled out from a super-aligned carbon nanotube array. The carbon nanotube film includes a plurality of successively oriented carbon nanotube segments joined end-to-end by van der Waals attractive force. Furthermore, each carbon nanotube segment includes a plurality of the carbon nanotubes. The carbon nanotubes have substantially the same length and are parallel to each other. Adjacent carbon nanotubes are combined together by van der Waals attractive force. Because carbon nanotubes have better electrical conductivity along a length thereof, the ordered carbon nanotube film has higher carrier mobility along the aligned direction than the disordered carbon nanotube film in the related art. A thickness of the carbon nanotube film ranges from about 0.5 nanometers to about 100 microns.

Figure 3:
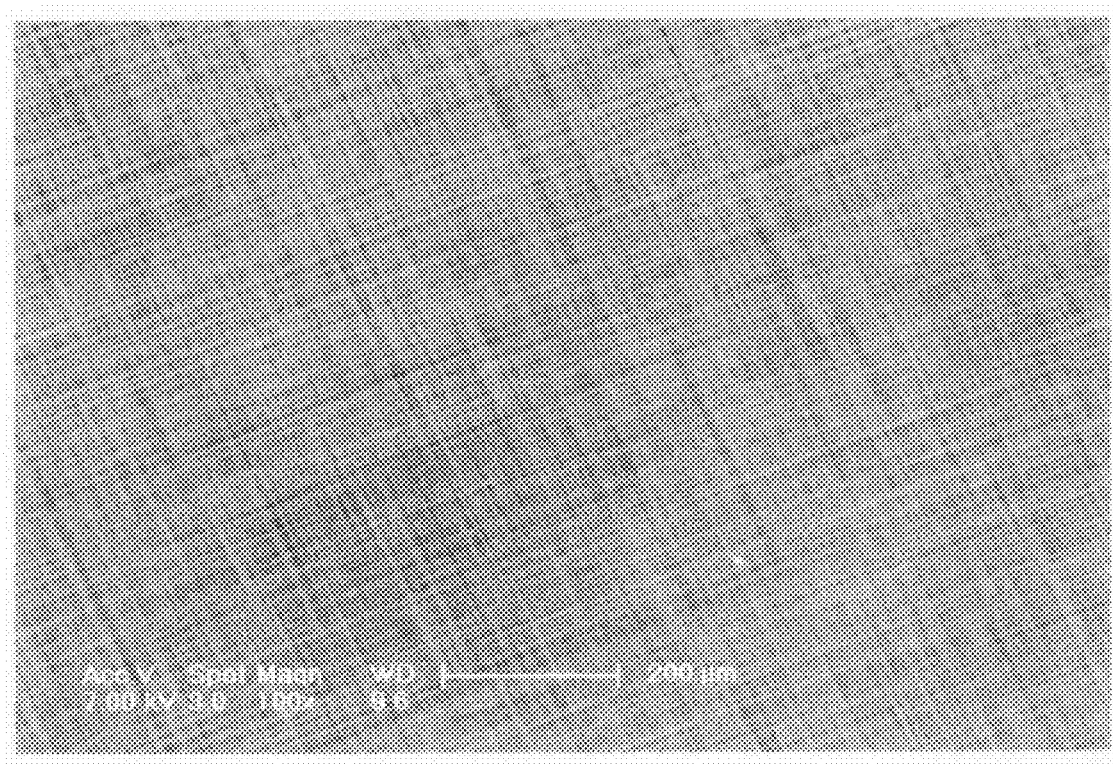
FIG. 3 shows a SEM image of two stacked carbon nanotube film containing semiconducting carbon nanotubes used in the thin film transistor of FIG. 1.

Referring to FIG. 3, in the present embodiment, the semiconducting layer 140 includes two stacked carbon nanotube films. Each carbon nanotube film includes a plurality of successive and oriented carbon nanotube segments joined end to end by van der Waals attractive force. Furthermore, each carbon nanotube segment includes a plurality of the carbon nanotubes. The carbon nanotubes have substantially the same length and are parallel to each other. Adjacent carbon nanotubes are combined together by van der Waals attractive force. The angle α between the aligned directions of the carbon nanotubes in two adjacent carbon nanotube films is 90°.

A length of the semiconducting layer 140 ranges from about 1 micron to about 100 microns. A width of the semiconducting layer 140 ranges from about 1 micron to 1 about millimeter. A thickness of the semiconducting layer 140 ranges from about 0.5 nanometers to about 100 microns. A length of the channel 156 ranges from about 1 micron to about 100 microns. A width of the channel 156 ranges from about 1 micron to about 1 millimeter. In the present embodiment, the length of the semiconducting layer 140 is about 50 microns, the width of the semiconducting layer 140 is about 300 microns, the thickness of the semiconducting layer 140 is about 1 micron, the length of the channel 156 is about 40 microns, and the width of the channel 156 is about 300 microns. The carbon nanotubes in one carbon nanotube films of the semiconducting layer 140 are oriented along a direction from the source electrode 151 to the drain electrode 152.

A material of the source electrode 151, the drain electrode 152, and the gate electrode 120 should have good conductive properties, and comprises of a material that is selected from a group consisting of pure metals, metal alloys, indium tin oxide (ITO), antimony tin oxide (ATO), silver paste, conductive polymer, and metallic carbon nanotubes and combinations thereof. The pure metals and metal alloys can be selected from a group consisting of aluminum, copper, tungsten, molybdenum, gold, cesium, palladium and combinations thereof. A thickness of the source electrode 151, the drain electrode 152, and the gate electrode 120 ranges from about 0.5 nanometers to about 100 microns. A distance between the source electrode 151 and the drain electrode 152 ranges from about 1 to about 100 microns.

In one embodiment, when the source electrode 151 and the drain electrode 152 are made of pure metals, metal alloys, indium tin oxide (ITO), or antimony tin oxide (ATO), a conducting layer can be formed by a depositing, sputtering, or evaporating method, and then etched to form the source electrode 151 and the drain electrode 152. In another embodiment, the source electrode 151 and the drain electrode 152 made of silver paste or conductive polymer can be formed directly by a printing method.

A material of the insulating layer 130 can be a rigid material such as silicon nitride ($Si_3N_4$), silicon dioxide ($SiO_2$), or a flexible material such as polyethylene terephthalate (PET), benzocyclobutenes (BCB), or acrylic resins. A thickness of the insulating layer 130 ranges from about 5 nanometers to about 100 microns. In the present embodiment, the insulating layer 130 is $Si_3N_4$.

Referring to FIG. 3, in use, the source electrode 151 is grounded. A voltage $V_{ds}$ is applied to the drain electrode 152. Another voltage $V_g$ is applied to the gate electrode 120. The voltage $V_g$ forms an electric field in the channel 156 of the semiconducting layer 140. Accordingly, carriers exist in the channel 156 nearing the gate electrode 120. As $V_g$ increases, current can flow from the source electrode 151 to the drain electrode 152 through the channel 156, thus the thin film transistor 10 is in an ON state, the source electrode 151 and the drain electrode 152 are electrically connected. When the semiconducting layer 140 is made of semiconducting carbon nanotube, and there are carbon nanotubes aligned along a direction from the source electrode 151 to the drain electrode 152, the high carrier mobility of the carbon nanotubes along the length direction thereof is very useful in the thin film transistor 10. The carrier mobility of the thin film transistor 10 in the present embodiment is higher than $10\,cm^2/V^{-1}s^{-1}$ (e.g., 10 to $1500\,cm^2/V^{-1}s^{-1}$), and the on/off current ratio ranges from about $1.0\times10^2$ to about $1.0\times10^6$.

Figure 4:
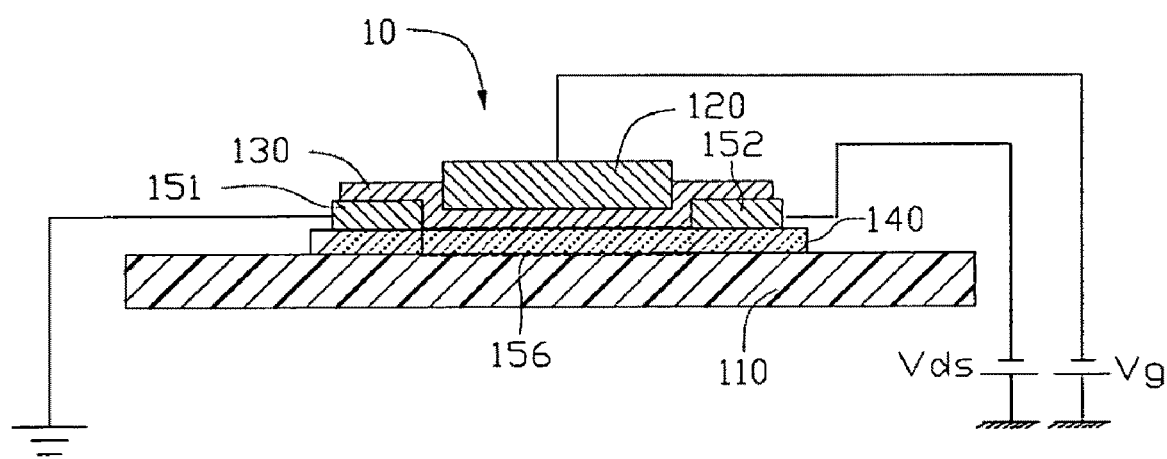
FIG. 4 is a schematic view of the thin film transistor of FIG. 1 connected to a circuit.
Figure 5:
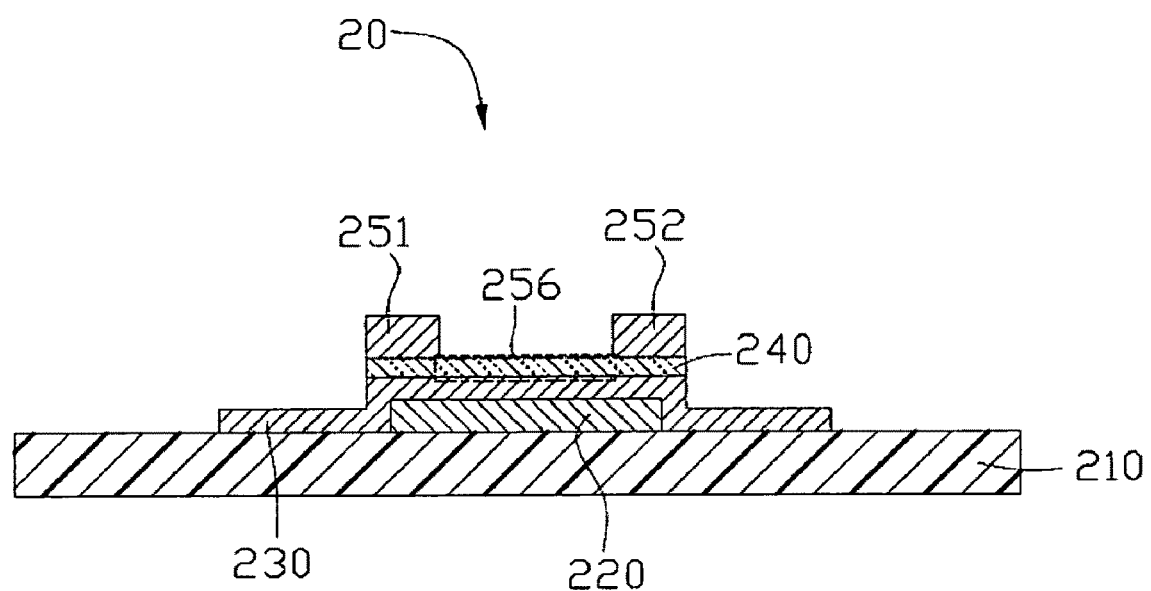
FIG. 5 is a cross sectional view of a thin film transistor in accordance with a second embodiment.

Referring to FIG. 4, a thin film transistor 20 is provided in a second embodiment and has a bottom gate structure. The thin film transistor 20 includes a gate electrode 220, an insulating layer 230, a semiconducting layer 240, a source electrode 251, and a drain electrode 252. The thin film transistor 20 is located on an insulating substrate 210.

The structure of the thin film transistor 20 in the second embodiment is similar to the thin film transistor 10 in the first embodiment. The difference is that, in the second embodiment, the gate electrode 220 is located on the insulating substrate 210. The insulating layer 230 covers the gate electrode 220. The semiconducting layer 240 is located on the insulating layer 230, and insulated from the gate electrode 220 by the insulating layer 230. The source electrode 251 and the drain electrode 252 are spaced apart from each other and connected to the semiconducting layer 240. The source electrode 251 and the drain electrode 252 are insulated from the gate electrode 220 by the insulating layer 230. A channel 256 is formed in the semiconducting layer 240 at a region between the source electrode 251 and the drain electrode 252.

The source electrode 251 and the drain electrode 252 can be located on the semiconducting layer 240 or on the insulating layer 230. More specifically, the source electrode 251 and the drain electrode 252 can be located on a top surface of the semiconducting layer 240, and at the same side of the semiconducting layer 240 with the gate electrode 220. In other embodiments, the source electrode 251 and the drain electrode 252 can be located on the insulating layer 230 and covered by the semiconducting layer 240. The source electrode 251 and the drain electrode 252 are located on different sides of the semiconducting layer 240. In other embodiments, the source electrode 251 and the drain electrode 252 can be formed on the insulating layer 230, and coplanar with the semiconducting layer 240.

The thin film transistors provided in the present embodiments have at least the following superior properties. Firstly, the semiconducting carbon nanotube layer is tough and flexible. Thus, thin film transistors using semiconducting carbon nanotube layers as semiconducting layer are durably flexible. Secondly, the semiconducting carbon nanotube layer is durable at high temperatures. Thirdly, the carbon nanotubes in the carbon nanotube film are aligned along a same direction and joined end to end by Van der Waals attractive force. Thus, in the semiconducting layer of the thin film transistor, the carbon nanotubes can be easily arranged to align along a direction from source electrode to drain electrode. Accordingly, the carrier mobility of the thin film transistor can be improved. Fourthly, flexibility of the thin film transistors using the carbon nanotube based semiconducting layer can be improved.

It is to be understood that the above-described embodiments are intended to illustrate rather than limit the invention. Variations may be made to the embodiments without departing from the spirit of the invention as claimed. The above-described embodiments illustrate the invention but do not restrict the scope of the invention.

The invention claimed is:

1. A thin film transistor comprising:
a source electrode;
a drain electrode spaced from the source electrode;
a semiconducting layer connected to the source electrode and the drain electrode;
an insulating layer; and
a gate electrode insulated from the source electrode, the drain electrode, and the semiconducting layer by the insulating layer;
wherein the semiconducting layer comprises at least two directly stacked carbon nanotube films, each carbon nanotube film comprising a plurality of semiconducting carbon nanotubes primarily oriented along a same direction, and the carbon nanotubes in at least two adjacent carbon nanotube films are aligned along different directions.

2. The thin film transistor as claimed in claim 1, wherein the carbon nanotubes are single-walled carbon nanotubes, double-walled carbon nanotubes, or any combination thereof.

3. The thin film transistor as claimed in claim 1, wherein a diameter of the carbon nanotubes is less than 10 nanometers.

4. The thin film transistor as claimed in claim 1, wherein the carbon nanotube film comprises a plurality of successively oriented carbon nanotube segments joined end-to-end by van der Waals attractive force therebetween, the carbon nanotube segments have the substantially same length, adjacent carbon nanotube segments are combined by van der Waals attractive force therebetween, and each carbon nanotube segment comprises a plurality of the carbon nanotubes arranged parallel with each other.

5. The thin film transistor as claimed in claim 1, wherein adjacent two carbon nanotube films are combined by van der Waals attractive force therebetween.

6. The thin film transistor as claimed in claim 1, wherein a material of the insulating layer is selected from a group consisting of silicon nitride, silicon dioxide, polyethylene terephthalate, benzocyclobutenes, and acrylic resins.

7. The thin film transistor as claimed in claim 1, wherein a material of the source electrode, drain electrode, or gate electrode is selected from a group consisting of pure metals, metal alloys, indium tin oxide, antimony tin oxide, silver paste, conductive polymer, metallic carbon nanotubes and combinations thereof.

8. The thin film transistor as claimed in claim 1, wherein a material of the source electrode, drain electrode, or gate electrode is selected from a group consisting of aluminum, copper, tungsten, molybdenum, gold, cesium, palladium and combinations thereof.

9. The thin film transistor as claimed in claim 1, wherein the insulating layer is located between the semiconducting layer and the gate electrode.

10. The thin film transistor as claimed in claim 1, wherein the semiconducting layer is located on an insulating substrate, the source electrode and the drain electrode are located on a surface of the semiconducting layer, the insulating layer is located on the semiconducting layer, and the gate electrode is located on the insulating layer.

11. The thin film transistor as claimed in claim 10, wherein a material of the insulating substrate is selected from a group consisting of silicon nitride, silicon dioxide, polyethylene terephthalate, benzocyclobutenes, and acrylic resins.

12. The thin film transistor as claimed in claim 10, wherein the source electrode and the drain electrode are located on a same side of the semiconducting layer.

13. The thin film transistor as claimed in claim 10, wherein the source electrode and the drain electrode are located on different sides of the semiconducting layer.

14. The thin film transistor as claimed in claim 1, wherein the gate electrode is located on an insulating substrate, the insulating layer is located on the gate electrode, the semiconducting layer is located on the insulating layer, the source electrode and the drain electrode are located on a surface of the semiconducting layer.

15. The thin film transistor as claimed in claim 1, further comprising a channel formed in the semiconducting layer at a region between the source electrode and the drain electrode, a length of the channel ranging from about 1 micron to about 100 microns, and a width of the channel ranging from about 1 micron to about 1 millimeter.

16. The thin film transistor as claimed in claim 15, wherein the channel comprises at least one of the at least two stacked carbon nanotube films.

17. The thin film transistor as claimed in claim 1, wherein the carrier mobility of the thin film transistor ranges from about 10 to about 1500 $cm^2/V^{-1}s^{-1}$, and the on/off current ratio ranges from about $1.0 \times 10^2$ to about $1.0 \times 10^6$.

18. A thin film transistor comprising:
a source electrode;
a drain electrode spaced from the source electrode;
a semiconducting layer connected to the source electrode and the drain electrode;
an insulating layer; and
a gate electrode insulated from the source electrode, the drain electrode, and the semiconducting layer by the insulating layer;
wherein the semiconducting layer consists of at least two directly stacked carbon nanotube films, each carbon nanotube film comprises a plurality of carbon nanotubes primarily oriented along a same direction, and the carbon nanotubes in at least one carbon nanotube film of the semiconducting layer are oriented along a direction from the source electrode to the drain electrode.

19. A thin film transistor comprising:
a source electrode;
a drain electrode spaced from the source electrode;
a semiconducting layer connected to the source electrode and the drain electrode;
an insulating layer; and
a gate electrode insulated from the source electrode, the drain electrode, and the semiconducting layer by the insulating layer;
wherein the semiconducting layer comprises two directly stacked carbon nanotube films, the two stacked carbon nanotube films are combined by van der Waals attractive force therebetween, each carbon nanotube film comprises a plurality of carbon nanotubes primarily oriented along a same direction, the carbon nanotubes in at least one carbon nanotube film of the semiconducting layer are oriented along a direction from the source electrode to the drain electrode.

* * * * *